(12) United States Patent
Kwon et al.

(10) Patent No.: US 11,710,757 B2
(45) Date of Patent: Jul. 25, 2023

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Ohguk Kwon, Asan-si (KR); Hyoeun Kim, Cheonan-si (KR); Sunkyoung Seo, Cheonan-si (KR); Sang-Uk Han, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 157 days.

(21) Appl. No.: 17/227,650

(22) Filed: Apr. 12, 2021

(65) Prior Publication Data

US 2022/0052097 A1    Feb. 17, 2022

(30) Foreign Application Priority Data

Aug. 13, 2020   (KR) ..................... 10-2020-0101847

(51) Int. Cl.
*H01L 27/146* (2006.01)
*H01L 23/00* (2006.01)
*H01L 23/48* (2006.01)

(52) U.S. Cl.
CPC ...... *H01L 27/14634* (2013.01); *H01L 23/481* (2013.01); *H01L 24/08* (2013.01); *H01L 24/73* (2013.01); *H01L 24/89* (2013.01); *H01L 27/1469* (2013.01); *H01L 27/14627* (2013.01); *H01L 2224/08146* (2013.01);

(Continued)

(58) Field of Classification Search
CPC ......... H01L 27/14634; H01L 27/14627; H01L 27/1469; H01L 23/481; H01L 24/08; H01L 24/73; H01L 24/89

See application file for complete search history.

(56) References Cited

U.S. PATENT DOCUMENTS

| 8,228,426 | B2 | 7/2012 | Matsuo et al. |
| 8,410,569 | B2* | 4/2013 | Yoshihara ......... H01L 27/14627 257/E31.127 |
| 9,419,033 | B2* | 8/2016 | Hsu .................. H01L 27/14636 |

(Continued)

FOREIGN PATENT DOCUMENTS

| JP | 6209288 | 10/2017 |
| JP | 2019-040893 | 3/2019 |

(Continued)

*Primary Examiner* — Nathan W Ha
(74) *Attorney, Agent, or Firm* — F. Chau & Associates, LLC

(57) ABSTRACT

Disclosed are semiconductor packages and methods of fabricating the same. The semiconductor package comprises a molding layer, a silicon layer on the molding layer, a glass upwardly spaced apart from the silicon layer, and a connection dam coupled to the silicon layer and connecting the silicon layer to the glass. The silicon layer includes a silicon layer body, a silicon layer via extending vertically in the silicon layer body, and a micro-lens array on a top surface of the silicon layer body. A bottom surface of the silicon layer body contacts a top surface of the molding layer. The molding layer includes a molding layer body, a molding layer via that extends vertically in the molding layer body and has electrical connection with the silicon layer via, and a connection ball connected to a bottom surface of the molding layer via.

19 Claims, 9 Drawing Sheets

(52) U.S. Cl.
CPC ............... *H01L 2224/73204* (2013.01); *H01L 2224/80895* (2013.01); *H01L 2224/80896* (2013.01)

(56) References Cited

U.S. PATENT DOCUMENTS

| | | | | |
|---|---|---|---|---|
| 2005/0258518 | A1* | 11/2005 | Yang | H01L 31/02325 257/E31.127 |
| 2006/0091515 | A1* | 5/2006 | Weng | H01L 27/14618 257/680 |
| 2006/0180887 | A1* | 8/2006 | Ono | H01L 27/14618 257/E31.118 |
| 2009/0059055 | A1 | 3/2009 | Nakano et al. | |
| 2009/0267170 | A1* | 10/2009 | Chien | H01L 27/14618 257/434 |
| 2009/0315164 | A1* | 12/2009 | Chow | H01L 24/97 257/E23.024 |
| 2011/0073975 | A1* | 3/2011 | Mukaida | H01L 27/14618 257/E31.127 |
| 2011/0227186 | A1* | 9/2011 | Chang | H01L 24/02 257/E31.124 |
| 2013/0137259 | A1 | 5/2013 | Bieck et al. | |
| 2014/0070348 | A1* | 3/2014 | Yee | H01L 27/14636 257/E31.127 |
| 2015/0061102 | A1* | 3/2015 | Lin | H01L 21/76898 257/692 |
| 2016/0118427 | A1* | 4/2016 | Hsu | H01L 27/14618 257/434 |
| 2017/0077158 | A1* | 3/2017 | Huang | H01L 27/14623 |
| 2017/0236761 | A1* | 8/2017 | Hsieh | H01L 23/49805 257/680 |
| 2017/0256496 | A1* | 9/2017 | Lin | H01L 24/02 |
| 2017/0263665 | A1 | 9/2017 | Komai et al. | |
| 2017/0360284 | A1 | 12/2017 | Yamashita et al. | |
| 2018/0337142 | A1* | 11/2018 | Cheng | H01L 23/04 |
| 2019/0244997 | A1* | 8/2019 | Yee | H01L 27/1464 |
| 2019/0348459 | A1 | 11/2019 | Katkar | |
| 2020/0098811 | A1* | 3/2020 | Chen | H01L 27/14618 |
| 2020/0203408 | A1 | 6/2020 | Nagata | H01L 21/56 |
| 2021/0028217 | A1* | 1/2021 | Cho | H01L 24/32 |
| 2021/0066368 | A1* | 3/2021 | Gang | H01L 27/14636 |
| 2021/0098324 | A1* | 4/2021 | Hsu | H01L 21/76898 |

FOREIGN PATENT DOCUMENTS

| | | |
|---|---|---|
| KR | 10-0572487 | 4/2006 |
| KR | 10-2018-0056165 | 5/2018 |

* cited by examiner

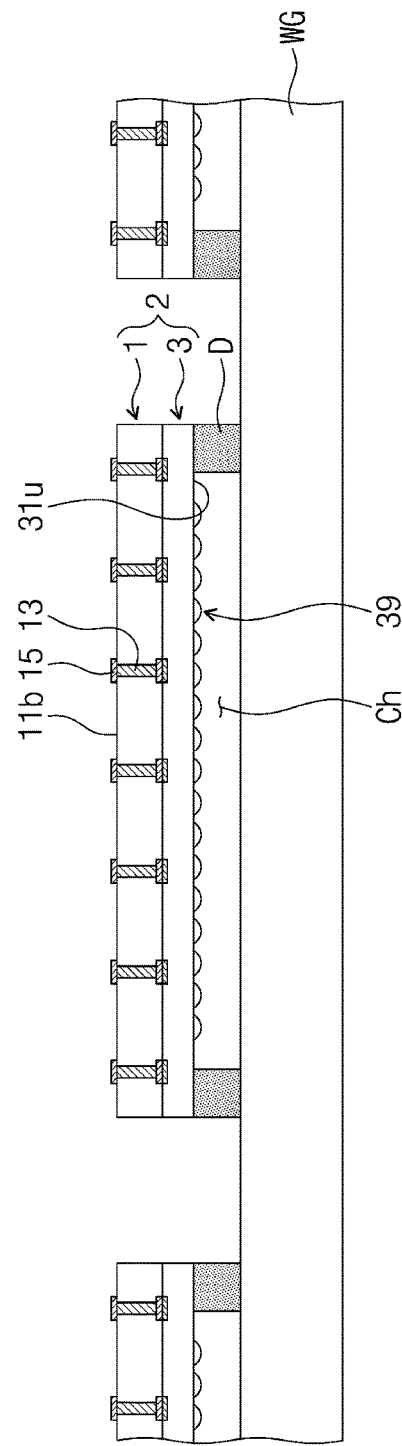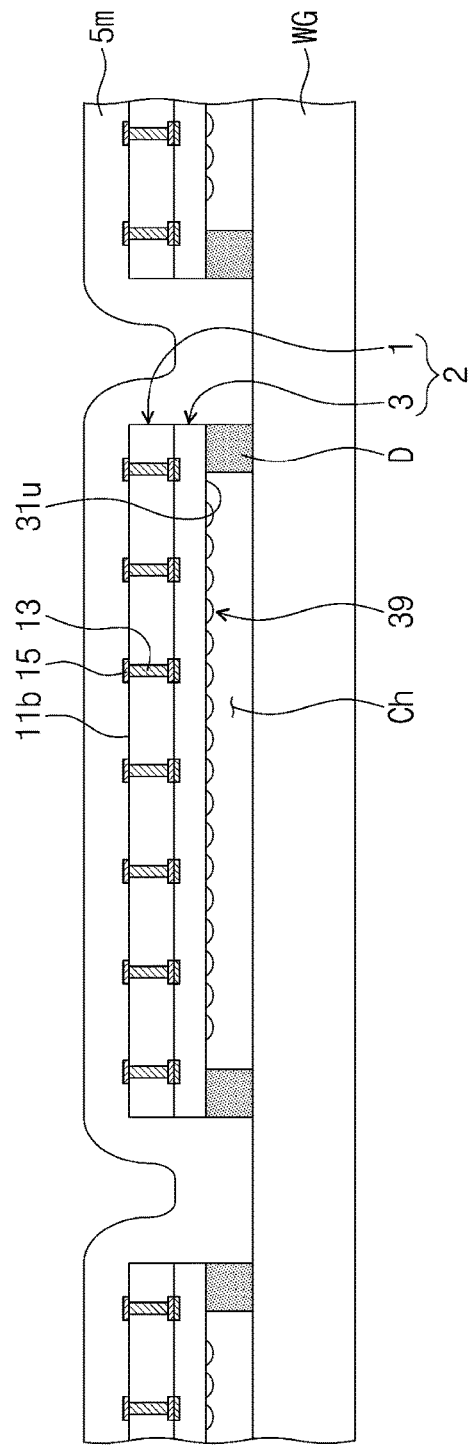

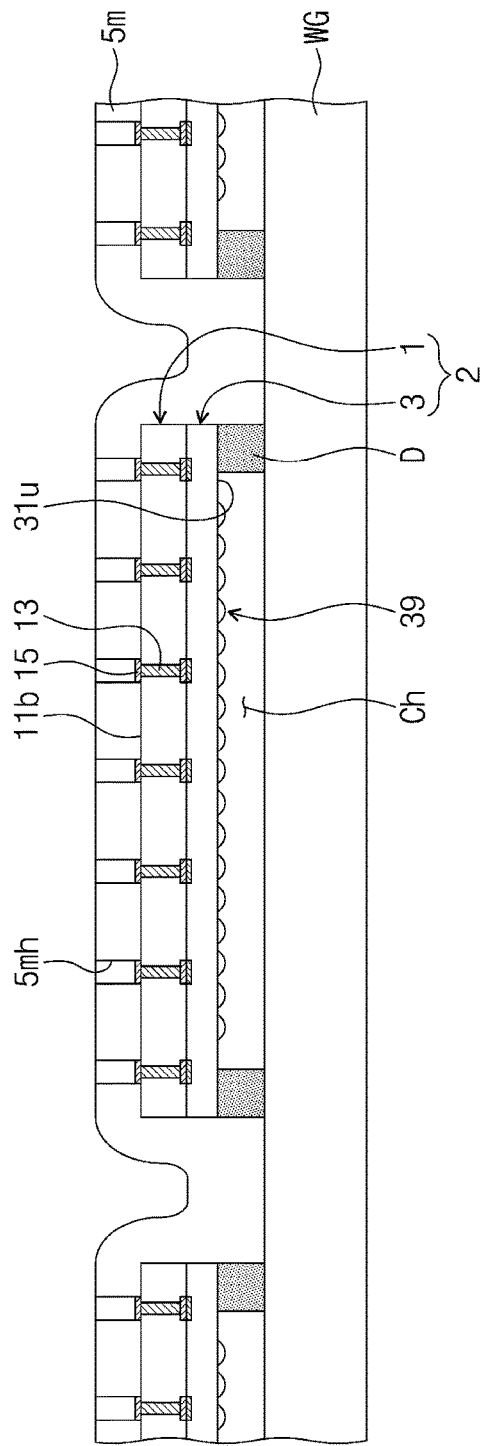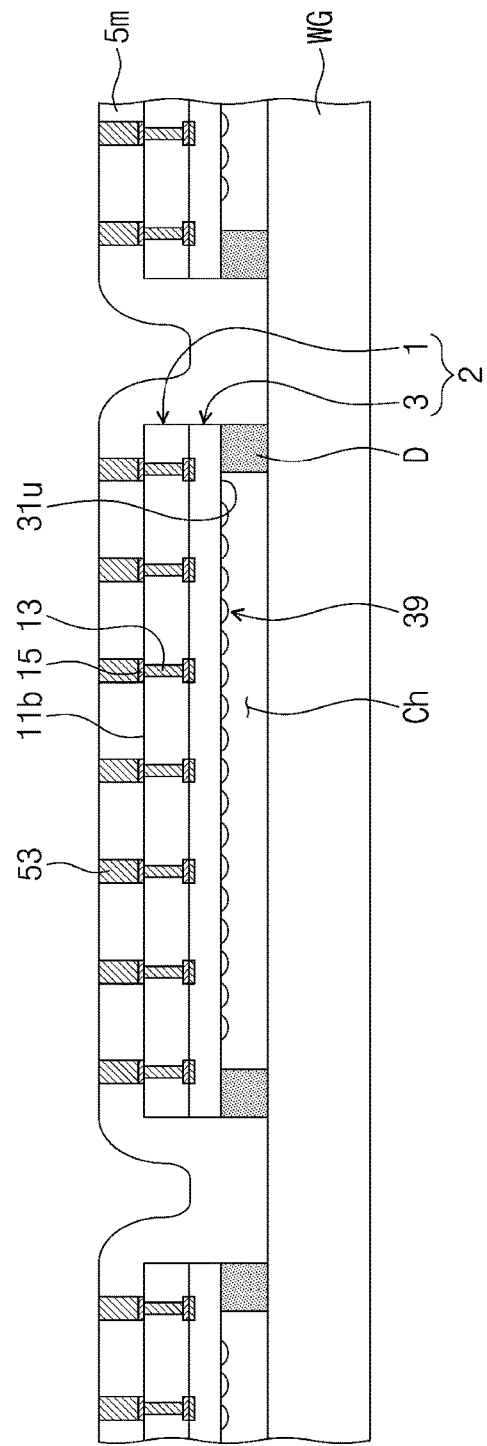

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 to Korean Patent Application No. 10-2020-0101847 filed on Aug. 13, 2020 in the Korean Intellectual Property Office, the disclosure of which is incorporated by reference herein in its entirety.

TECHNICAL FIELD

The present inventive concepts relate to a semiconductor package and a method of fabricating the same, and more particularly, to a semiconductor package whose strength is increased to prevent cracks and a method of fabricating the same.

DISCUSSION OF RELATED ART

A semiconductor package may implement an integrated circuit chip for use in electronic products. In general, the semiconductor package may be fabricated by mounting a semiconductor chip on a substrate such as a printed circuit board (PCB). The semiconductor package may be applied to an image sensor. The image sensor is a semiconductor-based sensor to receive light to generate electrical signals. The image sensor can be used for various electronic products such as mobile phones, digital cameras, optical mice, surveillance cameras, and biometric recognition apparatuses. There is increasing demand for electronic products with compactness, high integration, and high reliability of their semiconductor packages, including image sensors.

SUMMARY

Some example embodiments of the present inventive concepts provide a semiconductor package whose strength is increased to prevent cracks and a method of fabricating, the same.

Some example embodiments of the present inventive concepts provide a semiconductor package capable of preventing expansion in a keep-out-zone (KoZ) in a semiconductor chip and a method of fabricating the same.

Some example embodiments of the present inventive concepts provide a semiconductor package with a simplified manufacturing process and a method of fabricating the same.

According to some example embodiments of the present inventive concepts, a semiconductor package may include: a molding layer; a silicon layer on the molding layer; a glass upwardly spaced apart from the silicon layer; and a connection dam that is coupled to the silicon layer and connects the silicon layer to the glass. The silicon layer may include: a silicon layer body; a silicon layer via that extends vertically in the silicon layer body; and a micro-lens array on a top surface of the silicon layer body. A bottom surface of the silicon layer body may be in contact with a top surface of the molding layer. The molding layer may include: a molding layer body; a molding layer via that extends vertically in the molding layer body and has an electrical connection with the silicon layer via; and a connection ball connected to a bottom surface of the molding layer via.

According to some example embodiments of the present inventive concepts, a semiconductor package may include: a molding layer that includes a plurality of molding layer vias that extend in a first direction; a logic chip that includes a plurality of logic vias that extend in the first direction: a sensing chip on the logic chip; a glass spaced apart in the first direction from the sensing chip; and a connection dam that connects the glass to the sensing chip. The plurality of molding layer vias may be spaced apart from each other in a second direction that intersects the first direction. The plurality of logic vias may be spaced apart from each other in the second direction. Each of the plurality of molding layer vias may be connected to a corresponding logic via of the plurality of logic vias. The molding layer may further include: a molding layer body that surrounds the molding layer via; and a connection ball connected to a bottom surface of the molding layer via. A bottom surface of the logic chip may be in contact with a top surface of the molding layer body. The logic chip may further include a connection pad connected to a bottom surface of the logic via. The sensing chip may further include a micro-lens array.

According to some example embodiments of the present inventive concepts, a method of fabricating a semiconductor package may include: coupling a first wafer and a second wafer to each other to form a preliminary silicon layer; cutting the preliminary silicon layer to form a plurality of silicon layers in; coupling the plurality of silicon layers to a wafer glass; performing wafer molding to form a preliminary molding layer on the plurality of silicon layers; forming a via hole in the preliminary molding layer; filling the via hole with a conductive material to form a molding layer via; and forming a chip-scale package by cutting the preliminary molding layer and the wafer glass. Each of the plurality of silicon layers may include a logic chip and a sensing chip on the logic chip. The sensing chip may include a micro-lens array. The logic chip may include a logic via connected to the molding layer via. The step of coupling the plurality of silicon layers to the wafer glass may include using a connection dam to couple each of the plurality of silicon layers to the wafer glass.

Various objects and embodiments of the present inventive concepts are not limited to the mentioned above, and other objects and embodiments which have not been mentioned above will be clearly understood to those skilled in the art from the following description.

Details of other example embodiments are included ire the drawings and the following description.

BRIEF DESCRIPTION OF THE DRAWINGS

FIGS. 4 to 12 illustrate cross-sectional views showing manufacturing procedures according to the semiconductor package fabrication method of FIG. 3.

DETAILED DESCRIPTION OF EMBODIMENTS

Figure 1A:
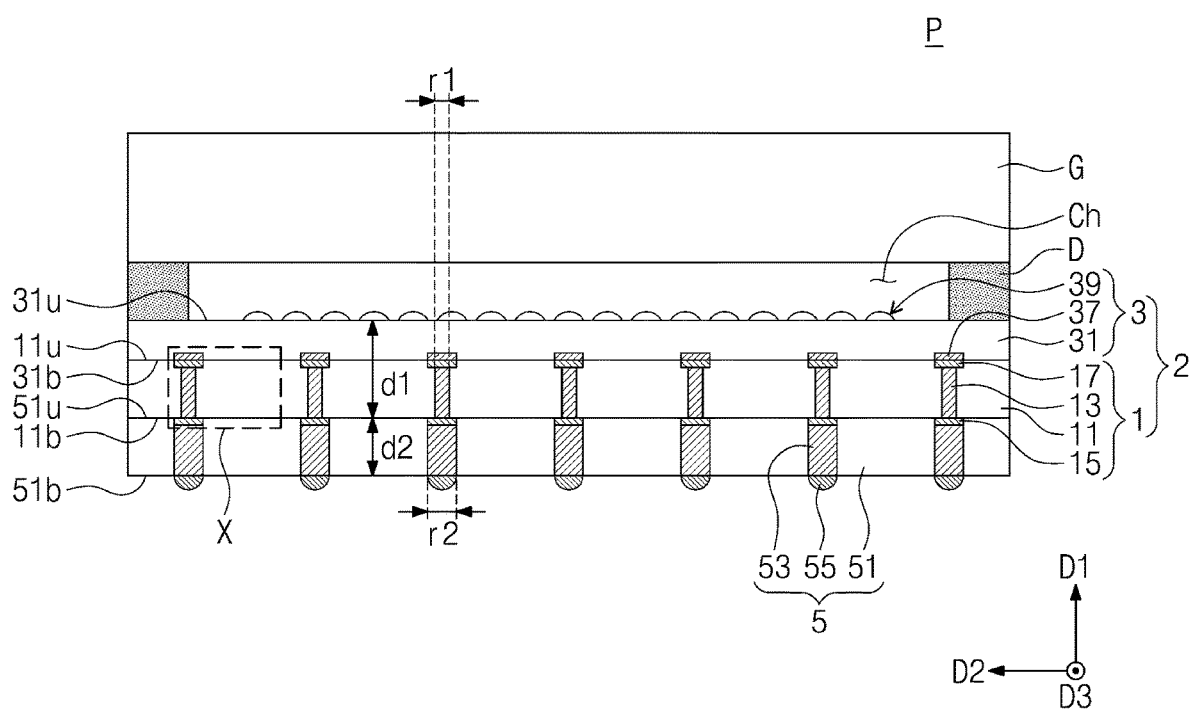
FIG. 1A illustrates a cross-sectional view showing a semiconductor package according to some example embodiments of the present inventive concepts.

The following will now describe some example embodiments of the present inventive concepts with reference to the accompanying drawings. Like reference numerals may indicate like components throughout the description, and to the extent that a description of an element has been omitted, it may be understood that the element is at least similar to corresponding elements that are described elsewhere in the specification. Additionally, description of a singular element may apply to a plurality of the same elements, unless the context of the description or referenced drawings indicates otherwise.

FIG. 1A illustrates a cross-sectional view showing a semiconductor package according to some example embodiments of the present inventive concepts.

In this description, the symbols D1, D2, and D3 of FIG. 1A may be respectively called a first direction, a second direction, and a third direction that intersects the first and second directions.

Referring to FIG. 1A, a semiconductor package P may be provided. The semiconductor package P may be an image sensor package. For example, the semiconductor package P may be a complementary metal oxide silicon image sensor (CIS) package. The semiconductor package P may include a silicon layer 2, a molding layer 5, a glass G, and a connection dam D.

The silicon layer 2 may be formed by sawing a larger silicon wafer. The silicon layer 2 may be positioned on the molding layer 5. For example, a bottom surface of the silicon layer 2 may contact a top surface of the molding layer 5. The silicon layer 2 may include a logic chip 1 and a sensing chip 3.

The logic chip 1 may be positioned below the sensing chip 3. For example, the logic chip 1 may be placed between the molding layer 5 and the sensing chip 3. The logic chip 1 may include a logic body 11, a logic via 13, a connection pad 15, and a logic chip pad 17. The logic body 11 may at least partially surround the logic via 13. The logic body 11 may include silicon (Si). For example, the logic body 11 may include a region formed of silicon (Si) in a silicon substrate. The logic body 11 may have a bottom surface 11b in contact with the molding layer 5. A detailed description thereof will be further discussed below. The logic body 11 may include a transistor and a wiring structure. The logic via 13 may extend in the first direction D1 in the logic body 11. The logic via 13 may include a conductive material. For example, the logic via 13 may include aluminum (Al) and/or copper (Cu), though the present disclosure is not necessarily limited thereto. The logic via 13 may have a diameter r1. The diameter r1 of the logic via 13 may be the same as or less than a diameter r2 of a molding layer via 53. For example, the diameter r1 of the logic via 13 may range from about 3 μm to about 7 μm. For example, the diameter r1 of the logic via 13 may be about 5 μm. In some example embodiments, the logic via 13 may be provided in a plurality. The plurality of logic vias 13 may be spaced apart from each other in one or both of the second and third directions D2 and D3. For convenience of description, the following: will focus on a single logic via 13. The logic via 13 may be called a silicon layer via. The connection pad 15 may be coupled to a bottom surface of the logic via 13. The logic via 13 may be electrically connected through the connection pad 15 to the outside of the logic chip 1. For example, the logic via 13 may be electrically connected through the connection pad 15 to the molding layer via 53. In this description, the language "connected" may carry multiple meanings, such as the meaning of "two components are connected to each other while being in direct contact with each other", and also the meaning of "two components are connected to each other through one or more other elements." In some example embodiments, the connection pad 15 may be provided in a plurality, and may correspond in number to the number of the logic vias 13. For convenience of description, the following will focus on a single connection pad 15. The above described embodiment describes the connection pad 15 as being used to connect the logic via 13 to the molding layer via 53, but the present inventive concepts are not necessarily limited thereto. For example, the logic via 13 and the molding layer via 53 may directly contact each other. For example, without the connection pad 15, the logic via 13 and the molding layer via 53 may be electrically connected to each other through a contact between the bottom surface of the logic via 13 and a top surface of the molding layer via 53. The logic chip pad 17 may be exposed on a top surface 11u of the logic body 11. The logic chip pad 17 may include a conductive material. The logic chip pad 17 may have a top surface in contact with a bottom surface of a sensing chip pad 37. Therefore, the logic chip pad 17 may be electrically connected to the sensing chip pad 37. The logic chip pad 17 may be provided in a plurality. The plurality of logic chip pads 17 may be spaced apart from each other in one or both of the second and third directions D2 and D3. For convenience of description, the following will focus on a single logic chip pad 17.

The sensing chip 3 may be positioned on the logic chip 1. The sensing chip 3 may include a sensing body 31, a sensing chip pad 37, and a micro-lens array 39. The sensing body 31 may include silicon (Si). For example, the sensing body 31 may include a region formed of silicon (Si) in a silicon substrate. The micro-lens array 39 may be provided on a top surface 31u of the sensing body 31. The sensing body 31 may have a bottom surface 31b in contact with the top surface 11u of the logic body 11. In some example embodiments, the sensing chip 3 and the logic chip 1 may be coupled to each other by direct wafer bonding. A detailed description thereof will be further discussed below. The sensing body 31 may be provided therein with a photodiode and a wiring structure. The sensing chip pad 37 may be exposed on the bottom surface 31b of the sensing body 31. The sensing chip pad 37 may include a conductive material. The bottom surface of the sensing chip pad 37 may contact the top surface of the logic chip pad 17. Therefore, the sensing chip pad 37 may be electrically connected to the logic chip pad 17. The sensing chip pad 37 may be provided in a plurality. The plurality of sensing chip pads 37 may be spaced apart from each other in one or both of the second and third directions D2 and D3. For convenience of description, the following will focus on a single sensing chip pad 37. The micro-lens array 39 may be positioned on the top surface 31u of the sensing body 31. The micro-lens array 39 may receive light, and may transfer the light to a photodiode disposed in the sensing body 31.

In some example embodiments, the logic body 11 and the sensing body 31 may constitute a silicon layer body. For example, the logic body 11 and the sensing body 31 combined may be expressed as the silicon layer body. The silicon layer body may have a thickness d1. For example, the thickness d1 may range from about 100 μm to about 200 μm. For example, the thickness d1 may be about 150 μm. The present inventive concepts, however, are not necessarily limited thereto.

The molding layer 5 may be positioned below the silicon layer 2. For example, the silicon layer 2 may be positioned on the molding layer 5. The molding layer 5 may include a molding layer body 51, a molding layer via 53, and a connection ball 55. The molding layer body 51 may at least partially surround a lateral surface of the molding layer via 53. The molding layer body 51 may include an epoxy molding compound (EMC). The molding layer body 51 may have a thickness d2. For example, the thickness d2 may range from about 50 μm to about 150 μm. For example, the thickness d2 may be about 100 μm. The present inventive concepts, however, are not necessarily limited thereto. The molding layer body 51 may have a width in a horizontal direction substantially the same as or similar to the width of the silicon layer body in the horizontal direction. For example, when viewed in plan, the molding layer body 51 may have a planar area substantially the same as or similar to that of the silicon layer body. The molding layer body 51 may have a top surface 51u in contact with a bottom surface of the silicon layer body. For example, the top surface 51u of the molding layer body 51 may contact the bottom surface 11b of the logic body 11. The connection ball 55 may be positioned on a bottom surface 51b of the molding layer body 51. The molding layer via 53 may extend in the first direction D1 in the molding layer body 51. The molding layer via 53 may include a conductive material. For example, the molding layer via 53 may include aluminum (Al) and/or copper (Cu), though the present disclosure is not necessarily limited thereto. In some example embodiments, the molding layer via 53 and the logic via 13 may have their axes positioned on substantially the same line. For example, the molding layer via 53 may have share a central vertical axis with a central vertical axis of the logic via 13. The molding layer via 53 may have a diameter r2. The diameter r2 of the molding layer via 53 may be the same as or greater than the diameter r1 of the logic via 13. For example, the diameter r2 of the molding layer via 53 may range from about 15 μm to about 25 μm. For example, the diameter r2 of the molding layer via 53 may be about 20 μm. The top surface of the molding layer via 53 may contact the connection pad 15. The molding layer via 53 may be electrically connected to the connection pad 15. In some example embodiments, the molding layer via 53 may be provided in a plurality. The plurality of molding layer vias 53 may be spaced apart from each other in one or both of the second and third directions D2 and D3. The plurality of molding layer vias 53 may be electrically connected to corresponding logic vias 13. An axis of each of the plurality of molding layer vias 53 may be positioned on substantially the same line as an axis of a corresponding connected logic via 13. It is explained above that the molding layer via 53 is provided in a plurality, but for convenience of description, the following will focus on a single molding layer via 53. The connection ball 55 may be coupled to a bottom surface of the molding layer via 53. The molding layer via 53 may be electrically connected through the connection ball 55 to the outside of the molding layer 5. In some example embodiments, the connection ball 55 may be provided in a plurality, and may correspond in number to the number of the molding layer vias 53. For convenience of description, the following will focus on a single connection ball 55.

The glass G may be spaced apart in the first direction D1 from the silicon layer 2. For example, the glass G may be upwardly spaced apart from the sensing chip 3. A cavity Ch may be provided between the glass G and the sensing chip 3. The glass G may be transparent to light. A light that passes through the glass G may be incident on a photodiode through the micro-lens array 39. The glass G may have a thickness greater than that of the silicon layer 2. For example, the glass G may have a thickness of about 300 μm to about 400 μm. For example, the glass G may have a thickness of about 350 μm in the first direction D1. The present inventive concepts, however, are not necessarily limited thereto, and the thickness of the glass G may depend on detailed applications of design.

The connection dam D may be positioned on the silicon layer 2. For example, the connection dam D may be coupled to the sensing chip 3. For example, the connection dam D may be coupled to the top surface 31u of the sensing body 31. The present inventive concepts, however, are not necessarily limited thereto. For example, when the sensing chip 3 has a width in a horizontal direction less than a width in the horizontal direction of the logic chip 1, the connection dam D may be coupled to the top surface 11u of the logic body 11. The connection dam D may have a thickness of about 100 μm to about 200 μm. For example, the connection dam D may have a thickness of about 150 μm in the first direction D1. The present inventive concepts, however, are not necessarily limited thereto, and the thickness of the connection dam D may depend on detailed applications of design. The connection dam D may separate the glass G from the silicon layer 2. For example, the connection dam D may cause the glass G to have a fixed position that is upwardly spaced apart from the silicon layer 2. The connection dam D may define the cavity Ch.

Figure 1B:
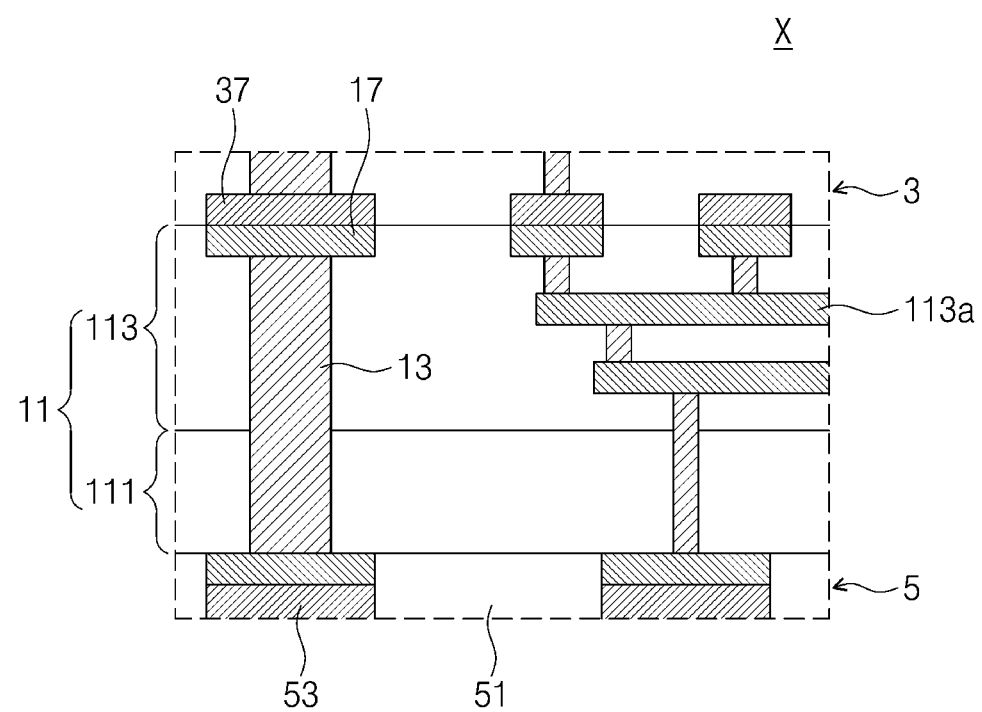
FIG. 1B illustrates an enlarged view showing section X of FIG. 1A.

FIG. 1B illustrates an enlarged view showing section X of FIG. 1A.

Referring to FIG. 1B, the logic body 11 may include a base layer 111 and a wiring layer 113. The logic via 13 may extend vertically in the base layer 111 and the wiring layer 113. The wiring layer 113 may be positioned on the base layer 111. A wiring structure 113a may be disposed in the wiring layer 113. The wiring structure 113a may be electrically connected to a via in the base layer 111 and/or a pad of the sensing chip 3.

Figure 2:
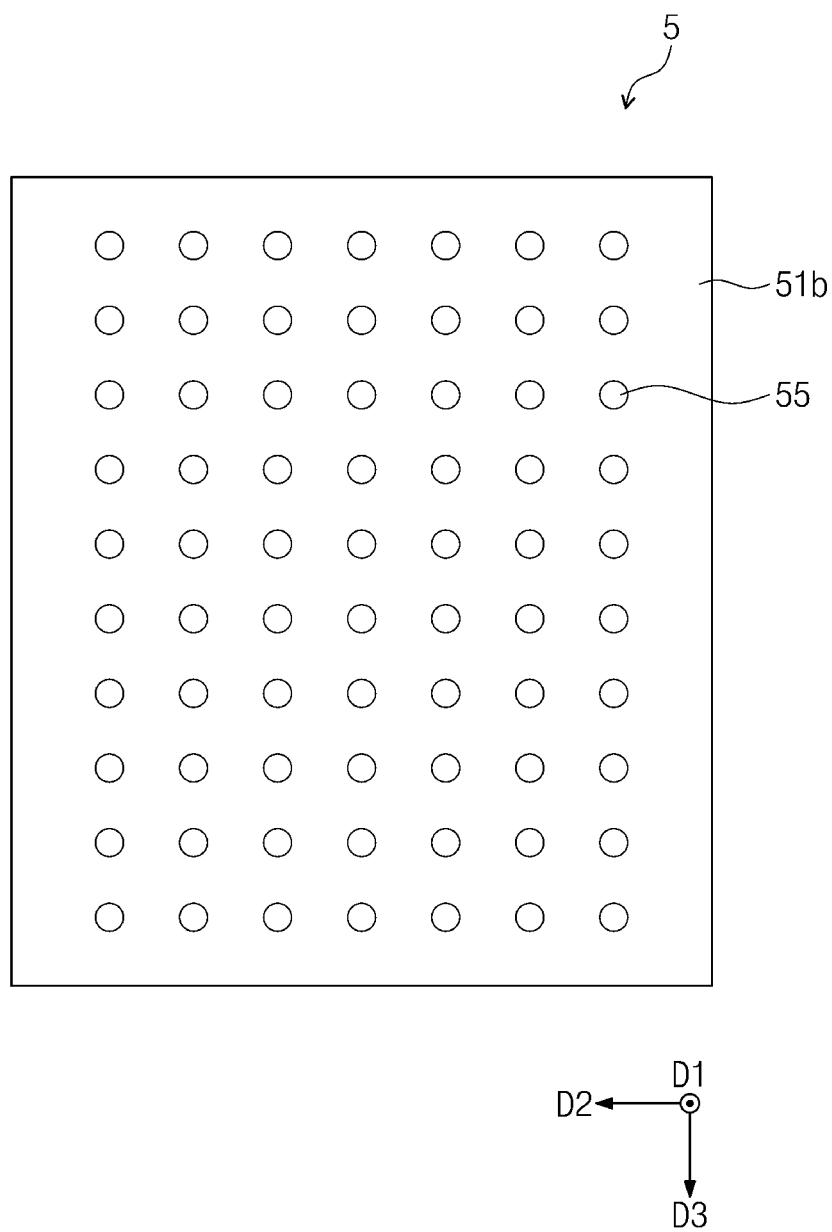
FIG. 2 illustrates a bottom view showing a semiconductor package according to some example embodiments of the present inventive concepts.

FIG. 2 illustrates a bottom view showing a semiconductor package according to some example embodiments of the present inventive concepts.

Referring to FIG. 2, the molding layer 5 may be exposed on a lower side of a semiconductor package. For example, the semiconductor package may have a bottom surface that corresponds to the bottom surface 51b of the molding layer 5. The connection ball 55 may be disposed on the bottom surface 51b of the molding layer 5, thereby being externally exposed.

A semiconductor package according to some example embodiments of the present inventive concepts may be configured such that a molding layer is provided below a silicon layer. A bottom surface of the silicon layer may be coupled to a top surface of the molding layer. The silicon layer and the molding layer may be considered as a single layer in terms of mechanical strength. Therefore, the molding layer may supplement the mechanical strength of the silicon layer. For example, even when the silicon layer has a small thickness, the molding layer may increase the strength of the silicon layer. Therefore, cracks may be prevented even when the silicon layer is thin. For example, the fracturing of the thin silicon layer due to a load from relatively thick glass may be prevented. For example, a connection dam may be used to couple the glass to the silicon layer, and thus even though a force is applied when the silicon layer is conveyed or packaged, fracturing of the silicon layer may be prevented. Additionally, stress concentrated at a location where the connection dam meets the silicon layer may be alleviated. Accordingly, even when the stress is concentrated at die location where the connection dam meets the silicon layer, the silicon layer may be prevented from being cracked.

The semiconductor package in accordance with some example embodiments of the present inventive concepts may have a silicon layer with increased mechanical strength. For example, it may be possible to supplement the strength of the silicon layer even without increasing the thickness of the silicon layer. Therefore, even when using a thin silicon layer, no cracks may occur on the silicon layer. Accordingly, it may be possible to use the thin silicon layer. Therefore, it may also be possible to prevent a diameter of a via that that penetrates the silicon layer from exceeding a certain level. Since the diameter of the via that penetrates the silicon layer is maintained below a certain level, it may be possible to reduce the area that the via occupies in the silicon layer. Accordingly, it may also be possible to reduce an area or size of a keep-out-zone (KoZ) that indicates an occupying region of the via in the silicon layer. The KoZ may be more generally referred to as a vicinity of the occupying region of the vias in the silicon layer. The KoZ may easily experience thermal stress caused by a difference in thermal expansion coefficient between a conductive material of the via and silicon around the via. Therefore, a transistor may not be easily placed into the KoZ. An increase in area of the KoZ may limit the placement of transistors in the silicon layer. In contrast, a reduction in area of the KoZ may allow the silicon layer to have an increased region for placement of transistors. Accordingly, as discussed in the semiconductor package of the present inventive concepts, when the via of the silicon layer maintains its diameter below a certain level, various components may be relatively freely arranged in the silicon layer. As a result, there may be reduced design parameters for semiconductor devices.

Figure 3:
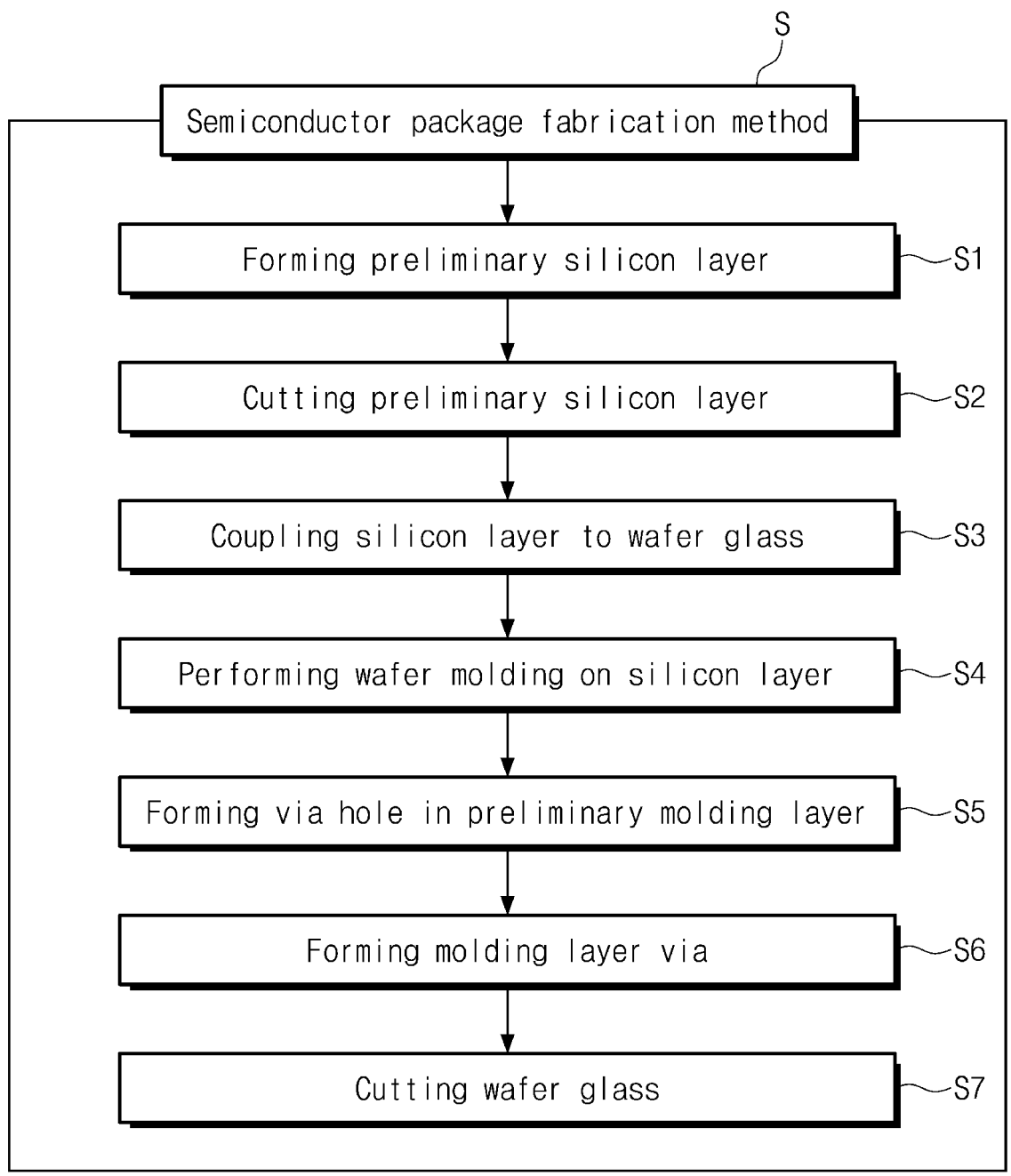
FIG. 3 illustrates a flow chart showing a method of fabricating a semiconductor package according to some example embodiments of the present inventive concepts.

FIG. 3 illustrates a flow chart showing a method of fabricating a semiconductor package according to some example embodiments of the present inventive concepts.

Referring, to FIG. 3, a semiconductor package fabrication method S may include forming a preliminary silicon layer (S1), cutting the preliminary silicon layer (S2), coupling a silicon layer to a wafer glass (S3), performing wafer molding on the silicon layer (S4), forming a via hole in a preliminary molding layer (S5), forming a molding layer via (S6), and cutting the wafer glass (S7).

Figure 4:
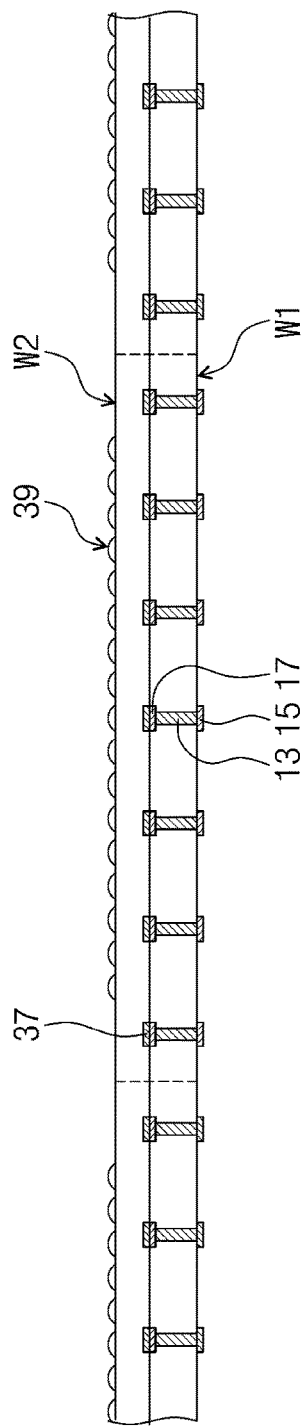

The following will describe in detail each step of the semiconductor package fabrication method S with reference to FIGS. 4 to 2.

FIGS. 4 to 12 illustrate cross-sectional views showing manufacturing procedures according to the semiconductor package fabrication method of FIG. 3.

Referring to FIGS. 3 and 4, the forming of the preliminary silicon layer (S1) may include coupling a first wafer W1 and a second wafer W2 to each other. The first wafer W1 may include various active and passive components that constitute a logic chip. The second wafer W2 may include various components that constitute a sensing chip. The first wafer W1 and the second wafer W2 may be coupled to each other by direct wafer bonding. For example, a wafer-on-wafer (WOW) bonding process may be performed to couple the first wafer W1 to the second wafer W2. Therefore, a direct contact may be achieved between a top surface of the first wafer W1 and a bottom surface of the second wafer W2. For example, the top surface of the first wafer W1 may be joined to the bottom surface of the second wafer W2, and a pad of the first wafer W1 may contact a pad of the second wafer W2. For another example, the pad of the first wafer W1 may be directly joined to the pad of the second wafer W2. The coupled first and second wafers W1 and W2 may be called a preliminary silicon layer.

Figure 5:
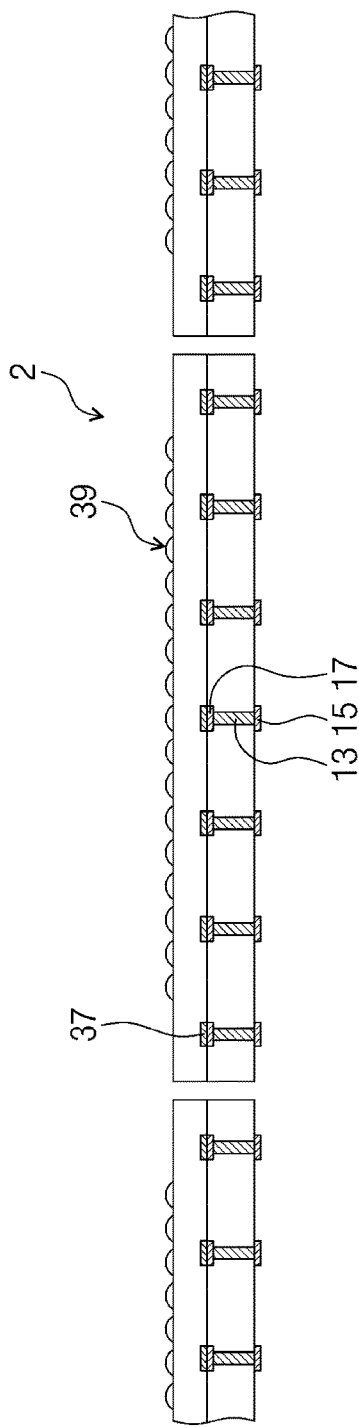

Referring to FIGS. 3 and 5, the cutting of the preliminary silicon layer (S2) may include sawing the preliminary silicon layer to form a silicon layer 2. For example, after the first and second wafers W1 and W2 are coupled to form the preliminary silicon layer, the preliminary silicon layer may be cut to a certain size. The preliminary silicon layer may be cut into a plurality of silicon layers 2.

Referring to FIGS. 3 and 6, the coupling of a silicon layer to a wafer glass (S3) may include a connection dam D that is used to couple the silicon layer 2 to a wafer glass WG. For example, the connection dam D may connect one surface of the wafer glass WG to a surface on which a micro-lens array 39 of the silicon layer 2 is exposed. In some example embodiments, the wafer glass G may mean a glass substrate in a wafer state. A plurality of silicon layers 2 may be coupled to a single wafer glass WG. The single wafer glass WG may be coupled to the plurality of silicon layers 2 which are spaced apart from each other in a horizontal direction. The silicon layer 2 may include a chip shape. Accordingly, a chip-on-wafer (COW) process may be performed in which the plurality of chip-shaped silicon layers 2 are coupled to the single wafer glass WG.

Referring to FIGS. 3 and 7, the performing of wafer molding on the silicon layer (S4) may include forming a preliminary molding layer 5m on the silicon layer 2 and/or the wafer glass WG. The formation of the preliminary molding layer 5m may be executed on the wafer glass WG in a wafer state. The preliminary molding layer 5m may at least partially cover one or more of a bottom surface 11b of a logic body, a connection pad 15, a lateral surface of the silicon layer 2, and an exposed surface of the wafer glass WG. The preliminary molding layer 5m may directly contact the bottom surface 11b of the logic body. For example, the preliminary molding layer 5m may directly contact the silicon layer 2.

Referring to FIGS. 3 and 8, the forming of a via hole in the preliminary molding layer (S5) may include forming a via hole 5mh in the preliminary molding layer 5m to expose the connection pad 15 or a logic via 13. The via hole 5mh may be downwardly recessed from a top surface of the preliminary molding layer 5m. In some example embodiments, a plurality of via holes 5mh may be formed. The plurality of via holes 5mh may be spaced apart from each other in a horizontal direction. For convenience of description, the following will focus on a single via hole 5mh. The via hole 5mh may be formed through various methods. For example, a drill may be used to form the via hole 5mh. For example, a laser drill may be used to form the via hole 5mh. The present inventive concepts, however, are not necessarily limited thereto, and the via hole 5mh may be formed by using different other methods.

Referring to FIGS. 3 and 9, the forming of a molding layer via (S6) may include filling the via hole (see 5mh of FIG. 9) with a conductive material. The conductive material that fills the via hole 5mh may form a molding layer via 53. In some example embodiments, the conductive material may include a metallic material, such as aluminum (Al) or copper (Cu). Various methods may be employed to fill the via hole 5mh with the conductive material. For example, an electroplating process may be performed to fill the via hole 5mh with the conductive material. The present inventive concepts, however, are not necessarily limited thereto, and different other methods may be performed to fill the via hole 5mh with the conductive material. When a plurality of via holes 5mh is provided, the plurality of via holes 5mh may all be filled with the conductive material. Since via hole 5mh exposes the connection pad 15 or the logic via 13, and the via hole 5mh is filled with conductive material to form the molding layer via 53, the molding layer via 53 may contact one or both of the connection pad 15 and the logic via 13. Therefore, the molding layer via 53 may be electrically connected to one or both of the connection pad 15 and the logic via 13.

Figure 10:
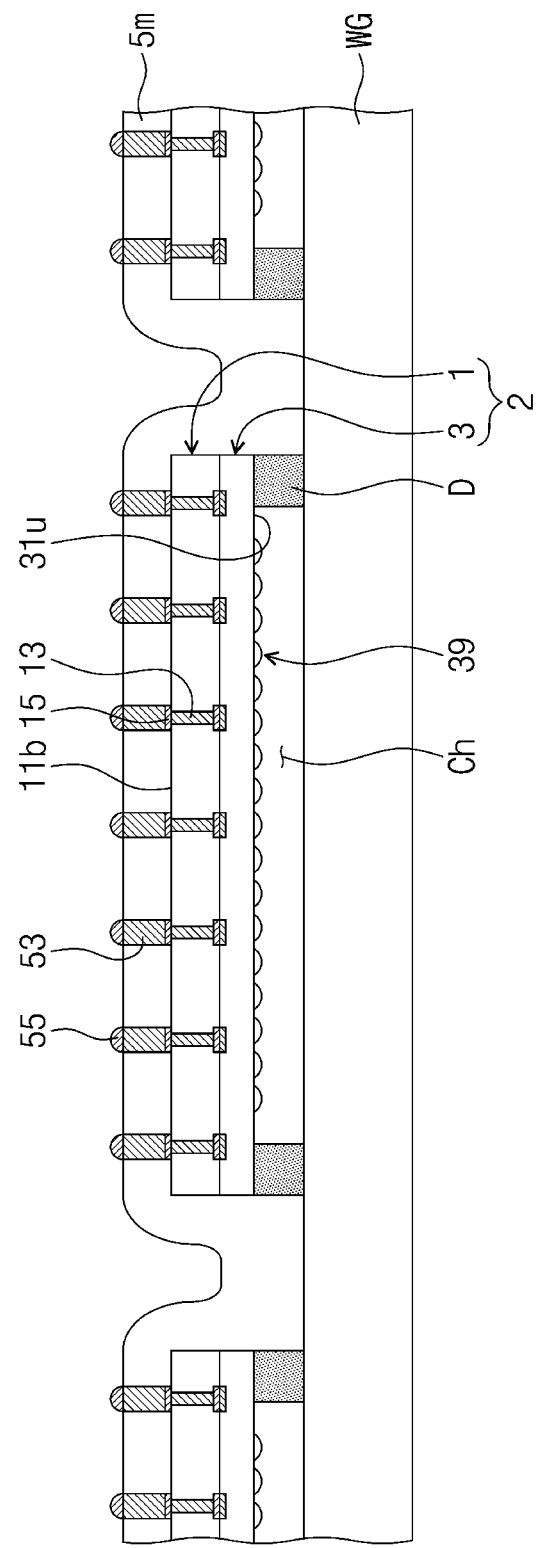

Referring to FIG. 10, a connection ball 55 may be bonded to the molding layer via 53. When the molding layer via 53 is provided as a plurality of molding layer vias 53, the connection ball 55 may also be provided as a plurality of connection balls 55. For convenience of description, the following will focus on a single connection ball 55. The connection ball 55 may include a solder ball. The connection ball 55 may be electrically connected to the molding layer via 53. The connection ball 55 may electrically connect the molding layer via 53 to the outside of the preliminary molding layer 5m.

Figure 11:
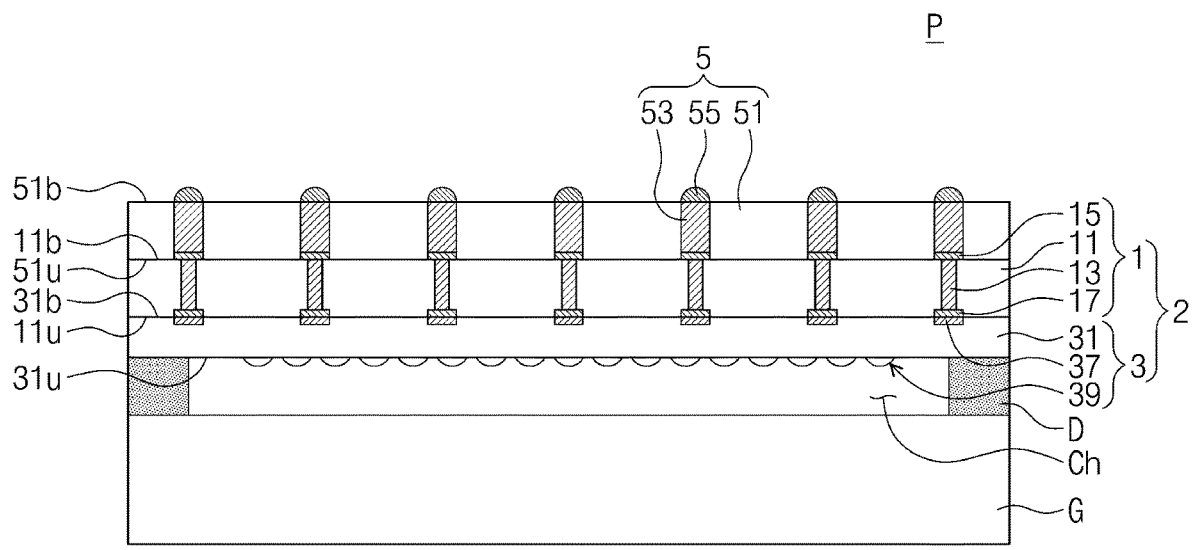

Referring to FIGS. 3 and 11, the cutting of the wafer glass (S7) may include sawing the preliminary molding layer 5m and/or the wafer glass WG in a wafer state. The cut wafer glass WG may be separated into a plurality of glasses G. The cut preliminary molding layer 5m may be separated into a plurality of molding layers 5. Each of a plurality of separated devices may be called a semiconductor package P. In some example embodiments, the preliminary molding layer 5m and/or the wafer glass WG in a wafer state may be diced (cut) based on a size of the silicon layer 2. Therefore, when viewed in plan, the molding layer 5 may have a planar area substantially the same as or similar to that of the silicon layer 2. In addition, the glass G may have a planar area substantially the same as or similar to that of the silicon layer 2. Thus, each of the separated semiconductor packages P may be a chip-scale package (CSP).

Figure 12:
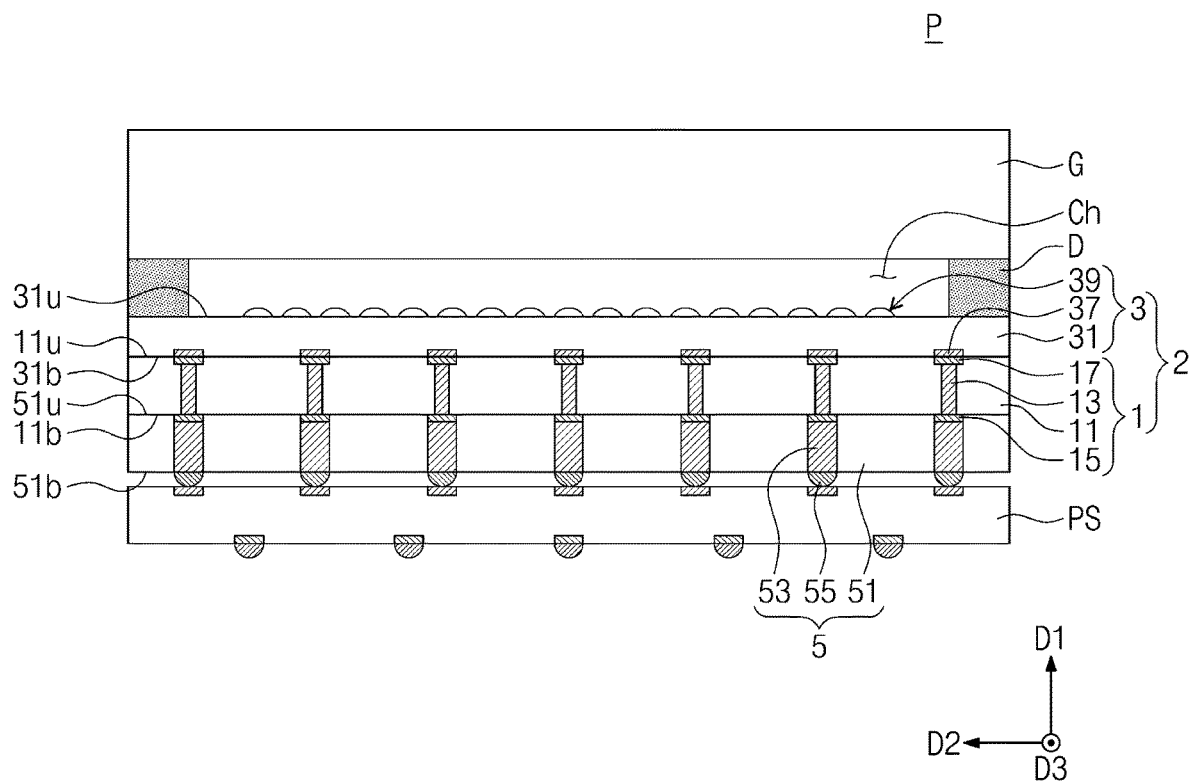

Referring to FIG. 12, the diced semiconductor package P may be coupled to a substrate PS. The substrate PS may include a printed circuit board (PCB) or a redistribution layer (RDL). For example, the semiconductor package P may be coupled through the connection ball 55 to the substrate PS. The semiconductor package P may be electrically connected through the connection ball 55 to the substrate PS. The semiconductor package P may be electrically connected through the substrate PS to the outside of the substrate PS.

Although not necessarily shown, the semiconductor package P may be coupled to the substrate PS through a memory chip or the like. For example, a memory chip may further be disposed below the molding layer 5, and the memory chip may be coupled to the substrate PS. In such cases, the semiconductor package P may be a 3-stack type semiconductor package in which a sensing chip, a logic chip, and a memory chip are stacked. The present inventive concepts, however, are not necessarily limited thereto, and the semiconductor package P may be a 2-stack type semiconductor package in which a sensing, chip and a logic chip are stacked as shown in FIG. 1A.

According to a semiconductor package fabrication method in accordance with some example embodiments of the present inventive concepts, a wafer level molding process may be performed to form a molding layer below a silicon layer. Therefore, a fast and simplified fabrication may be possible because the molding process is performed once. Accordingly, overall efficiency of fabrication may be increased.

According to a semiconductor package fabrication method in accordance with some example embodiments of the present inventive concepts, a molding layer via has a diameter greater than that of a logic via. A via hole filled with the molding layer via may have a relatively large diameter. Therefore, after the wafer level molding, the via hole may be formed with increased fabrication reliability. Accordingly, since the via hole is formed having a relatively large diameter, the degree of difficulty in forming the via hole may be relatively low. As a result, a fabrication may be simplified.

According to a semiconductor package and a method of fabricating the same of the present inventive concepts, the strength of the semiconductor may be increased to prevent the occurrence of crack.

According to a semiconductor package and a method of fabricating the same of the present inventive concepts, it may be possible to reduce the size of a keep-out-zone (KoZ) in a semiconductor chip.

According to a semiconductor package and a method of fabricating the same of the present inventive concepts, a simplified fabrication may be achieved.

Effects of the present inventive concepts are not limited to the mentioned above, other effects which have not been mentioned above will be clearly understood to those skilled in the art from the following description.

Although the present inventive concepts have been described in connection with the embodiments of the present inventive concepts illustrated in the accompanying drawings, it will be understood to those skilled in the art that various changes and modifications may be made without departing from the technical spirit and essential feature of the present inventive concepts. It therefore will be understood that the embodiments described above are illustrative but not limitative in all aspects.

What is claimed is:

1. A semiconductor package, comprising:
a molding layer;
a silicon layer on the molding layer;
a glass spaced apart from the silicon layer; and
a connection dam that is coupled to the silicon layer and connects the silicon layer to the glass,
wherein the silicon layer includes:
a silicon layer body;
a silicon layer via disposed in the silicon layer body; and
a micro-lens array disposed on a top surface of the silicon layer body,
wherein a bottom surface of the silicon layer body contacts a top surface of the molding layer, and
wherein the molding layer includes:
a molding layer body;
a molding layer via disposed in the molding layer body and electrically connected to the silicon layer via; and
a connection ball connected to a bottom surface of the molding layer via, wherein a diameter of the molding layer via is greater than a diameter of the silicon layer via, and the molding layer via has substantially the same diameter from a top surface of the molding layer to a bottom surface of the molding layer.

2. The semiconductor package of claim 1, wherein
a thickness of the silicon layer body is about 100 μm to about 200 μm, and
a thickness of the molding layer body is about 50 μm to about 150 μm.

3. The semiconductor package of claim 1, wherein
the diameter of the silicon layer via is about 3 μm to about 7 μm, and
the diameter of the molding layer via is about 15 μm to about 25 μm.

4. The semiconductor package of claim 1, wherein the silicon layer further includes a logic chip and a sensing chip on the logic chip, and
   wherein a bottom surface of the logic chip is in contact with the top surface of the molding layer.

5. The semiconductor package of claim 4, wherein a top surface of the logic chip and a bottom surface of the sensing chip are coupled to each other by wafer bonding.

6. The semiconductor package of claim 1, wherein the silicon layer further includes a connection pad on the bottom surface of the silicon layer body,
   wherein a top surface of the connection pad is in contact with a bottom surface of the silicon layer via,
   wherein a bottom surface of the connection pad is in contact with a top surface of the molding layer via, and
   wherein an axis of the silicon layer via and an axis of the molding layer via are positioned on the same line.

7. The semiconductor package of claim 1, wherein
   a bottom surface of the silicon layer via is in contact with a top surface of the molding layer via, and
   wherein an axis of the silicon layer via and an axis of the molding layer via are positioned on the same line.

8. The semiconductor package of claim 1, wherein the molding layer body includes an epoxy molding compound.

9. The semiconductor package of claim 1, wherein a width in a horizontal direction of the silicon layer is the same as a width in the horizontal direction of the molding layer.

10. A semiconductor package, comprising:
    a molding layer that includes a plurality of molding layer vias that extend in a first direction;
    a logic chip that includes a plurality of logic vias that extend in the first direction, and a plurality of logic chip pads;
    a sensing chip disposed on the logic chip and including a plurality of sensing chip pads;
    a glass spaced apart in the first direction from the sensing chip; and
    a connection dam that connects the glass to the sensing chip,
    wherein the plurality of molding layer vias are spaced apart from each other in a second direction that intersects the first direction,
    wherein the plurality of logic vias are spaced apart from each other in the second direction,
    wherein each of the plurality of molding layer vias is connected to a corresponding logic via of the plurality of logic vias,
    wherein each of the plurality of logic chip pads directly contacts a corresponding sensing chip pad of the plurality of sensing chip pads,
    wherein the molding layer further includes:
      a molding layer body that surrounds at least one of the molding layer vias; and
      a connection ball connected to a bottom surface of at least one of the molding layer vias,
    wherein a bottom surface of the logic chip contacts a top surface of the molding layer body,
    wherein the logic chip further includes a connection pad connected to a bottom surface of the logic via, and
    wherein the sensing chip further includes a micro-lens array.

11. The semiconductor package of claim 10, wherein a diameter of the molding layer via is greater than a diameter of the logic via.

12. The semiconductor package of claim 11, wherein
    the diameter of the logic via is about 3 μm to about 7 μm, and
    the diameter of the molding layer via is about 15 μm to about 25 μm.

13. The semiconductor package of claim 10, wherein a top surface of the logic chip and a bottom surface of the sensing chip are coupled to each other by wafer bonding.

14. The semiconductor package of claim 10, wherein the molding layer body includes an epoxy molding compound.

15. A method of fabricating a semiconductor package, the method comprising:
    coupling a first wafer and a second wafer to each other to form a preliminary silicon layer;
    cutting the preliminary silicon layer to form a plurality of silicon layers;
    coupling the plurality of silicon layers to a wafer glass;
    performing wafer molding to form a preliminary molding layer on the plurality of silicon layers;
    forming a via hole in the preliminary molding layer;
    filling the via hole with a conductive material to form a molding layer via; and
    forming a chip-scale package by cutting the preliminary molding layer and the wafer glass,
    wherein at least one of the plurality of silicon layers includes a logic chip and a sensing chip disposed on the logic chip,
    wherein the sensing chip includes a micro-lens array,
    wherein the logic chip includes a logic via connected to the molding layer via, and
    wherein coupling the plurality of silicon layers to the water glass includes using a connection dam coupling each of the plurality of silicon layers to the wafer glass with a connection dam, and wherein a diameter of the molding layer via is greater than a diameter of the logic via, and the molding layer via has substantially the same diameter from a top surface of the preliminary molding layer to a bottom surface of the preliminary molding layer.

16. The method of claim 15, wherein
    a diameter of the logic via is about 3 μm to about 7 μm, and
    a diameter of the molding layer via is about 15 μm to about 25 μm.

17. The method of claim 15, wherein a laser drill is used to form the via hole in the preliminary molding layer.

18. The method of claim 15, further comprising coupling the chip-scale package to a substrate.

19. The method of claim 15, wherein the first wafer and the second wafer are coupled to each other by direct wafer bonding.

* * * * *